(12) United States Patent
Wang et al.

(10) Patent No.: US 11,563,071 B2
(45) Date of Patent: Jan. 24, 2023

(54) DISPLAY PANEL, MANUFACTURING METHOD AND DETECTING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jun Wang, Beijing (CN); Zhantao Wang, Beijing (CN); Runmin Tang, Beijing (CN); Qiancheng Zhao, Beijing (CN); Xing Ren, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 306 days.

(21) Appl. No.: 16/617,962

(22) PCT Filed: Mar. 18, 2019

(86) PCT No.: PCT/CN2019/078498
§ 371 (c)(1),
(2) Date: Nov. 27, 2019

(87) PCT Pub. No.: WO2020/001085
PCT Pub. Date: Jan. 2, 2020

(65) Prior Publication Data
US 2021/0359071 A1 Nov. 18, 2021

(30) Foreign Application Priority Data

Jun. 29, 2018 (CN) .......................... 201810712863.X

(51) Int. Cl.
*H01L 27/32* (2006.01)
*H01L 51/00* (2006.01)
(Continued)

(52) U.S. Cl.
CPC ......... *H01L 27/3276* (2013.01); *G09G 3/006* (2013.01); *H01L 51/0031* (2013.01);
(Continued)

(58) Field of Classification Search
CPC .. H01L 27/3276; H01L 51/0031; G09G 3/006
See application file for complete search history.

(56) References Cited

U.S. PATENT DOCUMENTS 9,929,344 B1 3/2018 Lee et al.
2007/0170948 A1 7/2007 Chang et al.
(Continued)

FOREIGN PATENT DOCUMENTS

CN 101350356 A 1/2009
CN 100578796 C 1/2010
(Continued)

OTHER PUBLICATIONS

Second Office Action dated Oct. 13, 2020 corresponding to Chinese application No. 201810712863.X.
(Continued)

*Primary Examiner* — Aaron J Gray
(74) *Attorney, Agent, or Firm* — Nath, Goldberg & Meyer; Joshua B. Goldberg

(57) ABSTRACT

A display panel, methods for manufacturing and detecting the display panel and a display device are provided. The display panel includes: a substrate, including a display region and a circuit region; multiple signal line terminals in the circuit region, coupled with signal lines respectively; multiple switch elements in the circuit region, first terminals of the switch elements are coupled with the signal line
(Continued)

terminals respectively; multiple leads located in the circuit region and on a side of the signal line terminals distal to the display region, spaced apart from each other along a first direction, extending along a second direction, first ends of the leads are coupled with the second terminals of the switch elements respectively, second ends of the leads in the second direction extend to an edge of the substrate, each switch element is configured to connect or disconnect the first terminal and the second terminal thereof.

7 Claims, 6 Drawing Sheets

(51) Int. Cl.
  *H01L 51/56* (2006.01)
  *G09G 3/00* (2006.01)
(52) U.S. Cl.
  CPC .......... *H01L 51/56* (2013.01); *H01L 27/3223* (2013.01); *H01L 2251/5392* (2013.01); *H01L 2251/566* (2013.01)

(56) References Cited

U.S. PATENT DOCUMENTS

| | | | | |
|---|---|---|---|---|
| 2008/0117345 | A1* | 5/2008 | Ishii | G02F 1/136204 349/40 |
| 2012/0162165 | A1* | 6/2012 | Lee | G09G 3/006 345/206 |
| 2014/0375344 | A1* | 12/2014 | Wang | G09G 3/006 324/760.02 |

FOREIGN PATENT DOCUMENTS

| CN | 103208264 A | 7/2013 |
|---|---|---|
| CN | 106952933 A | 7/2017 |
| CN | 108807492 A | 11/2018 |

OTHER PUBLICATIONS

Office Action dated Mar. 23, 2020 issued in corresponding Chinese Application No. 201810712863.X.

* cited by examiner

DISPLAY PANEL, MANUFACTURING METHOD AND DETECTING METHOD THEREOF, AND DISPLAY DEVICE

CROSS-REFERENCE TO RELATED APPLICATION

This is a National Phase Application filed under 35 U.S.C. 371 as a national stage of PCT/CN2019/078498, filed Mar. 18, 2019, an application claiming the benefit of Chinese Application No. 201810712863.X, filed Jun. 29, 2018, the content of each of which is hereby incorporated by reference in its entirety.

TECHNICAL FIELD

The present disclosure relates to the field of display panel manufacture and detection, and more particularly, to a display panel, methods for manufacturing and detecting the display panel, and a display device.

BACKGROUND

Nowadays, in a production process for a display panel, laser is used to cut products.

SUMMARY

According to the first aspect of the present disclosure, a display panel is provided.

According to embodiments of the present disclosure, the display panel includes:

a substrate, wherein a surface of the substrate includes a display region and a circuit region thereon, and the circuit region is disposed at a side of the display region;

a plurality of signal line terminals located in the circuit region, the plurality of signal line terminals are electrically coupled with signal lines for the display region in one-to-one correspondence; a plurality of switch elements located in the circuit region, each of the plurality of switch elements has a first terminal and a second terminal, first terminals of the plurality of switch elements are electrically coupled with the plurality of signal line terminals in one-to-one correspondence; a plurality of leads located in the circuit region and on a side of the plurality of switch elements distal to the display region, spaced apart from each other along a first direction and extending along a second direction, first ends of the plurality of leads in the second direction are electrically coupled with the second terminals of the plurality of switch elements in one-to-one correspondence, and second ends of the plurality of leads in the second direction extend to an edge of the substrate, wherein each of the plurality of switch elements is configured to connect or disconnect the first terminal and the second terminal thereof.

In some implementations of the present disclosure, the display panel further includes a switch line located between the plurality of leads and the plurality of signal line terminals and extending along the first direction, wherein each of the plurality of switch elements further has a third terminal, the switch line is electrically coupled with the third terminal of each of the plurality of switch elements, and the third terminal of each of the plurality of switch elements is configured to control the first terminal and the second terminal thereof to be connected or disconnected.

In some implementations of the present disclosure, the switch line has a first connection terminal and a second connection terminal opposite to each other in the first direction, and the first connection terminal and the second connection terminal both are located in the circuit region.

In some implementations of the present disclosure, the surface of the substrate further includes two test regions thereon, the two test regions and the circuit region are located at a same side of the display region, and the two test regions are located at both sides of the circuit region in the first direction, respectively; and the switch line extends into the two test regions and has a third connection terminal and a fourth connection terminal opposite to each other in the first direction, and the third connection terminal and the fourth connection terminal are located in the two test regions, respectively.

In some implementations of the present disclosure, the plurality of switch elements are located at positions where the switch lines overlap the plurality of leads and the plurality of signal line terminals, respectively.

In some implementations of the present disclosure, each of the plurality of switch elements is a thin film transistor.

According to the second aspect of the present disclosure, a method for manufacturing the display panel is provided.

According to embodiments of the present disclosure, the method includes: providing a motherboard, wherein a surface of the motherboard includes a plurality of effective regions thereon, and each of the plurality of effective regions includes a display region and a circuit region, and the circuit region is disposed at a side of the display region; forming a plurality of leads in the circuit region of each of the plurality of effective regions; forming a plurality of signal line terminals in the circuit region of each of the plurality of effective regions; forming a plurality of switch elements in the circuit region; cutting the motherboard to obtain the display panel; wherein the plurality of signal line terminals are disposed in the circuit region, and the plurality of signal line terminals are electrically coupled with signal lines in the display region in one-to-one correspondence, the plurality of switch elements are disposed in the circuit region, and each of the plurality of switch elements has a first terminal and a second terminal, first terminals of the plurality of switch elements are electrically coupled with the plurality of signal line terminals in one-to-one correspondence, and the plurality of leads are disposed in the circuit region and located at a side of the plurality of switch elements distal to the display region, spaced apart from each other along a first direction and extending along a second direction, first ends of the plurality of leads in the second direction are electrically coupled with the second terminals of the plurality of switch elements in one-to-one correspondence, and second ends of the plurality of leads in the second direction extends to an edge of the substrate; wherein each of the plurality of switch elements is configured to connect or disconnect the first terminal and the second terminal thereof.

In some implementations of the present disclosure, each of the plurality of switch elements further includes a third terminal, and before cutting the motherboard to obtain the display panel, the method further includes: forming a switch line between the plurality of leads and the plurality of signal line terminals, wherein the switch line is electrically coupled with the third terminal of each of the plurality of switch elements, and the third terminal of each of the plurality of switch elements is configured to control the first terminal and the second terminal thereof to be connected or disconnected.

In some implementations of the present disclosure, forming the switch line between the plurality of leads and the plurality of signal line terminals further includes forming a first connection terminal and a second connection terminal at both ends of the switch line respectively, and the first connection terminal and the second connection terminal are opposite to each other in the first direction, and the first connection terminal and the second connection terminal both are located in the circuit region.

In some implementations of the present disclosure, each of the plurality of effective regions further includes two test regions, and forming the switch line between the plurality of leads and the plurality of signal line terminals further includes: forming a third connection terminal and a fourth connection terminal at two ends of the switch line respectively, and the third connection terminal and the fourth connection terminal are opposite to each other in the first direction and are disposed in the two test regions respectively.

In some implementations of the present disclosure, forming the switch line between the plurality of leads and the plurality of signal line terminals further includes: forming at least a portion of the switch line at positions where the plurality of switch elements overlap the plurality of leads and the plurality of signal line terminals respectively.

In some implementations of the present disclosure, each of the plurality of switch elements is a thin film transistor, and forming the plurality of switch elements in the circuit region further includes: forming the first terminal of the thin film transistor by at least a portion of a wire electrically coupled with the signal line terminal; forming the second terminal of the thin film transistor by at least a portion of the lead; and forming an active layer between the wire and the lead; forming an insulating layer on surfaces of the lead, the active layer and the lead distal to the motherboard; and forming the third terminal of the thin film transistor on a surface of the insulating layer distal to the active layer by at least a portion of the switch line.

According to the third aspect of the present disclosure, a method for detecting the display panel is provided.

According to embodiments of the present disclosure, the display panel includes: a substrate, wherein a surface of the substrate includes a display region and a circuit region thereon, and the circuit region is disposed at a side of the display region: a plurality of signal line terminals located in the circuit region, the plurality of signal line terminals are electrically coupled with signal lines for the display region in one-to-one correspondence; a plurality of switch elements located in the circuit region, each of the plurality of switch elements has a first terminal and a second terminal, first terminals of the plurality of switch elements are electrically coupled with the plurality of signal line terminals in one-to-one correspondence; a plurality of leads located in the circuit region and on a side of the plurality of switch elements distal to the display region, spaced apart from each other along a first direction and extending along a second direction, first ends of the plurality of leads in the second direction are electrically coupled with the second terminals of the plurality of switch elements in one-to-one correspondence, and second ends of the plurality of leads in the second direction extend to an edge of the substrate, wherein each of the plurality of switch elements is configured to connect or disconnect the first terminal and the second terminal thereof, and the method includes: applying, under the control of a lighting signal, a first voltage to each of the plurality of switch elements such that the plurality of switch elements are turned on.

In some implementations of the present disclosure, the display panel further includes a switch line disposed between the plurality of leads and the plurality of signal line terminals and extending along the first direction, and each of the plurality of switch elements further has a third terminal, the switch line is electrically coupled with the third terminal of each of the plurality of switch elements, and the third terminal of each of the plurality of switch elements is configured to control the first terminal and the second terminal thereof to be connected or disconnected; the surface of the substrate further includes two test regions thereon, the two test regions and the circuit region are located at a same side of the display region, and the two test regions are located at both sides of the circuit region in the first direction, respectively; and the switch line extends into the two test regions and has a third connection terminal and a fourth connection terminal opposite to each other in the first direction, and the third connection terminal and the fourth connection terminal are located in the two test regions, respectively, wherein each of the plurality of switch elements is a thin film transistor, and applying, under the control of the lighting signal, the first voltage to each of the plurality of switch elements such that the plurality of switch elements are turned on further includes: applying the first voltage between the third connection terminal and the fourth connection terminal of the switch line to turn on each of the thin film transistors.

In some implementations of the present disclosure, the switch line has a first connection terminal and a second connection terminal opposite to each other in the first direction, and the first connection terminal and the second connection terminal both are located in the circuit region, and the method further includes: applying, under the control of a module signal, a second voltage between the first connection terminal and the second connection terminal of the switch line to turn off each of the thin film transistors.

According to the fourth aspect of the present disclosure, a display device is provided.

According to embodiments of the present disclosure, the display device includes the display panel.

Additional aspects and advantages of the present disclosure will be set forth partly in the following description, and part of them will become apparent based on the following description and will be understood by implementing the present disclosure.

BRIEF DESCRIPTION OF THE FIGURES

Embodiments below will be explained with reference to the foregoing aspects of the disclosure, taken in connection with the following drawings.

DETAILED DESCRIPTION

In a production process for a display panel, laser is used to cut a product to obtain display panels, and due to the high temperature, leads (e.g., leads of signal lines coupled between cutting regions of a display panel master for testing of a motherboard before cutting) near a cutting region are easily to be melted to form a black conductive carbide at a cutting section of the product, and a distance between leads of adjacent signal lines in a circuit region is only 4 micrometers, so that a short circuit may easily occur when a lighting test is performed, which causes defects of crosstalk and dark line or bright line (X-Line), thereby decreasing the yield of the display panels.

In view of the above, an object of the present disclosure is to provide a display panel with improved cutting quality and higher manufacturing yield.

Embodiments of the present disclosure are described in detail below, and it will be understood by those skilled in the art that the following embodiments are intended to illustrate the present disclosure and should not be construed as limiting the present disclosure. As for those embodiments in which the specific techniques or conditions are not explicitly described below, those skilled in the art may implement the embodiments according to techniques or conditions commonly used in the art or product specifications, unless otherwise indicated.

In one aspect of the present disclosure, a display panel is provided.

Figure 2:
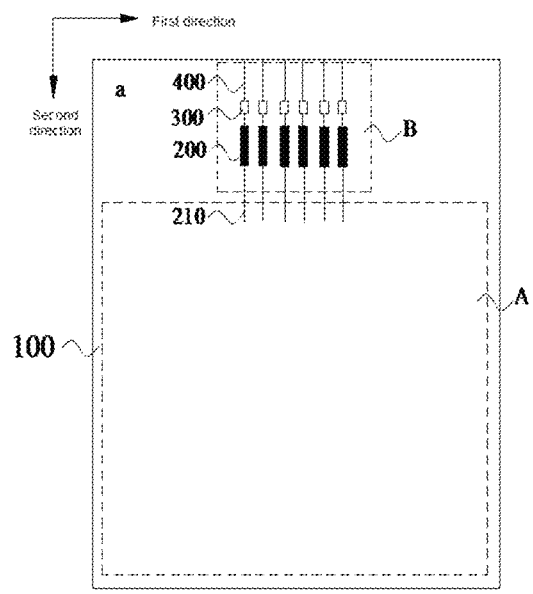
FIG. 2 is schematic top view of a display panel according to an embodiment of the present disclosure.

According to an embodiment of the present disclosure, referring to FIG. 2, a display panel includes: a substrate 100, a plurality of signal line terminals 200, a plurality of switch elements 300, and a plurality of leads 400. A display region A and a circuit region B are defined on a first surface "a" of the substrate 100, and the circuit region B is disposed at one side of the display region A. The plurality of signal line terminals 200 are disposed in the circuit region B, and each of the signal line terminals 200 is electrically coupled with one signal line 210. The plurality of switch elements 300 are disposed in the circuit region B, a first terminal of each of the switch elements 300 is electrically coupled with one signal line terminal 200. The plurality of leads 400 are disposed in the circuit region B, spaced apart from each other along a first direction and extend in a second direction, and first ends of the leads 400 in the second direction are electrically coupled with second terminals of the switch elements 300 in one-to-one correspondence, and second ends of the leads 400 extend to an edge of the substrate 100. It should be noted that the first direction and the second direction are disposed to intersect with each other. Each of the switch elements 300 may be a Thin Film Transistor (TFT), a first terminal of which may be one of a source electrode and a drain electrode and a second terminal may be the other one of the source electrode and the drain electrode.

According to the present disclosure, the switch elements are disposed between the signal line terminals coupled with the signal lines and the leads, and by controlling the plurality of the switch elements, even if a conductive foreign matter generated during the laser cutting process would cause the leads to be coupled with each other, the defects of crosstalk and X-Line caused by the conductive foreign matter can be prevented, and the related problems can be completely eliminated, and therefore a quality of laser cutting and a manufacturing yield of display panels are improved.

Figure 1:
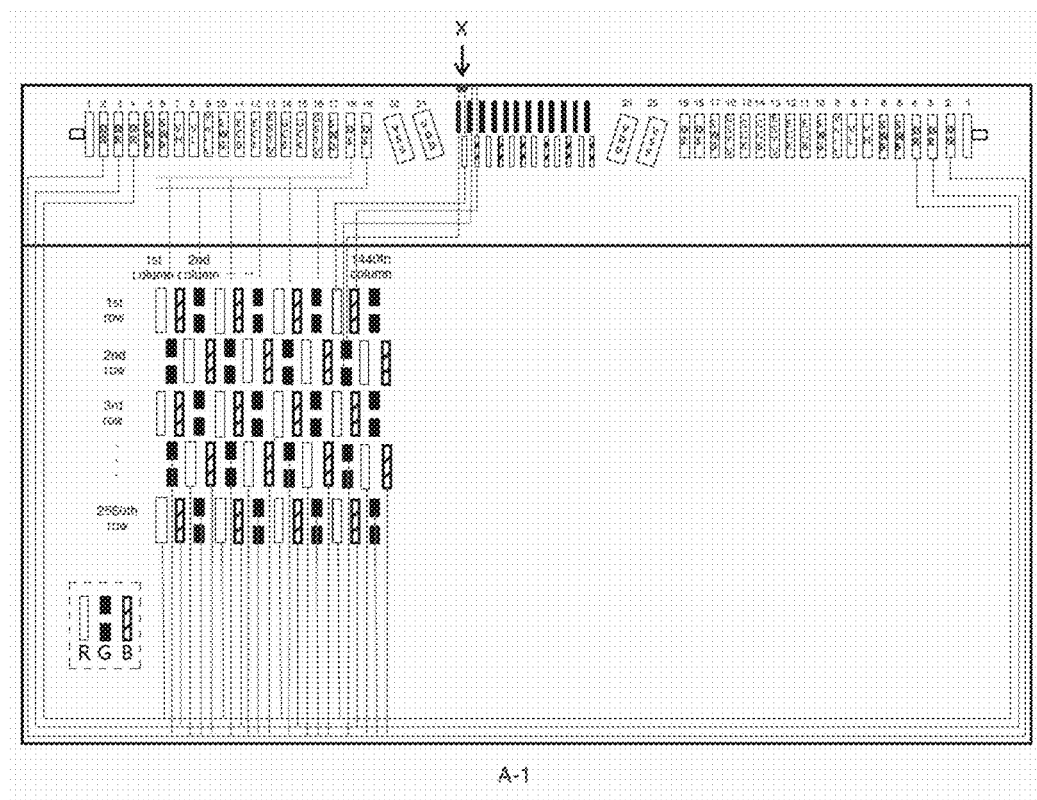
FIG. 1 is a schematic top view of a display panel of the related art with conductive foreign matter remaining in a circuit region after laser cutting process.
Figure 1:
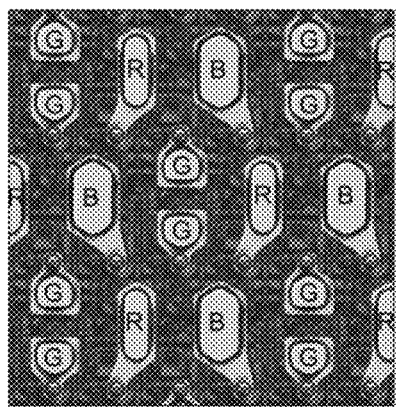

According to an embodiment of the present disclosure, types of the signal lines 210 and the signal line terminals 200 are not specifically limited, and may be selected by one of ordinary skill according to a specific structural design of the display panel. In some embodiments of the present disclosure, each of the signal lines 210 may be a data line, and each of the signal line terminal 200 may be a data line terminal, as such, the defects of crosstalk and X-Line caused by the laser cutting can be solved by providing the plurality of switch elements 300 to be coupled with the data line terminals respectively. Referring to FIG. 1, after the laser cutting process, in a display panel of the related art, it is possible for a conductive foreign matter X remained after a high temperature melting to couple leads of adjacent data lines in a wiring region to each other, thereby causing a short circuit. Then, during an exploratory (ET) lighting test, for example, a short circuit between the leads of the data lines respectively coupled with a green (G) sub-pixel and a red (R) sub-pixel occurs, which may cause the defects of crosstalk and X-Line, and then a dark line or a bright line occurs in the display region of the display panel. Thereby, the manufacturing yield, display image quality and long-term use stability of the display panel will be decreased. Part A-2 of FIG. 1 shows a picture of distribution of sub-pixels in the display region shown in Part A-1 of FIG. 1.

Figure 3:
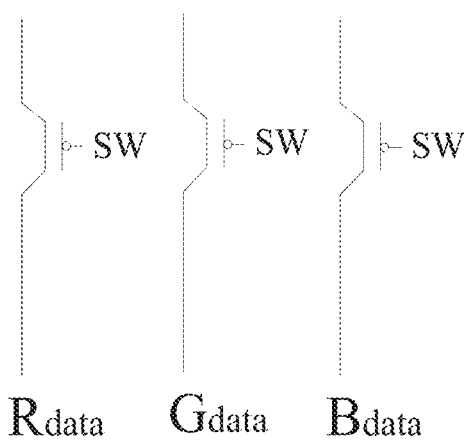
FIG. 3 is an equivalent circuit schematic diagram of switch elements according to an embodiment of the present disclosure.

According to the present disclosure, the switch elements 300 are provided between the leads 400 coupled with the signal lines 210 and the signal line terminals 200 respectively (the circuit diagram of which can refer to FIG. 3). In this way, by controlling the plurality of switch elements 300, that is, by turning off each of the switch elements 300, even if a conductive foreign matter X generated during the laser cutting process would cause the leads 400 to be coupled with each other (the circuit diagram in this case can refer to FIG. 4), the defects of crosstalk and X-Line caused by the conductive foreign matter X can be prevented, and the related problems can be completely eliminated, and therefore a quality of laser cutting and a manufacturing yield of the display panels are improved.

According to the embodiments of the present disclosure, the specific type of the display panel is not particularly limited, specifically, the display panel may be, for example, an Organic Light Emitting Diode (OLED) display panel and the like. The specific type of the display panel may be selected by those skilled in the art according to the actual usage requirement for the display panel, and details thereof are not repeated herein.

According to the embodiment of the present disclosure, the numbers of the signal line terminals 200, the switch elements 300 and the leads 400 are not particularly limited. In FIG. 2, as an example, the numbers of the signal line terminals 200, the switch elements 300 and the leads 400 are 6, respectively, and in FIGS. 3 and 4, only three lines for R data, G data and B data are shown as an example, which may be designed and adjusted by those skilled in the art according to a number of sub-pixels of the display panel, and details thereof are not repeated herein.

The following description will be given by taking the switch elements 300 being thin film transistors (i.e., TFTs) as an example, but it should be noted that the specific type of each of the switch elements 300 is not particularly limited, and those skilled in the art may change the type of each of the switch elements according to the actual usage requirement, and details thereof are not repeated herein.

Figure 5:
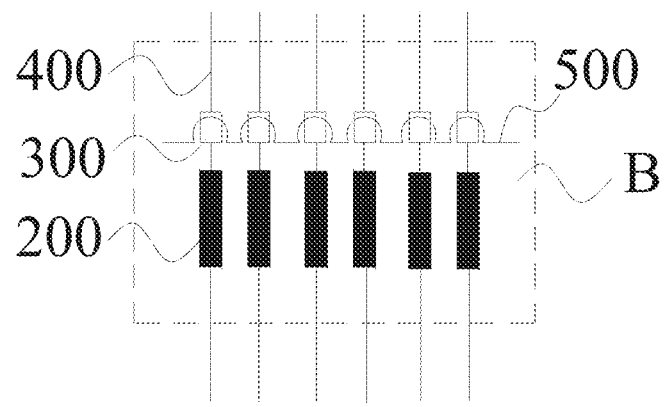
FIG. 5 is a schematic top view of a circuit region according to an embodiment of the present disclosure.

According to an embodiment of the present disclosure, referring to FIG. 5, the display panel may further include a switch line 500, the switch line 500 is disposed in the circuit region B and electrically coupled with the plurality of thin film transistors 300. The switch line 500 is electrically coupled with a gate electrode of each of the plurality of thin film transistors. As such, the switch elements (i.e., the plurality of TFTs) can be simultaneously controlled by the switch line 500.

Figure 6:
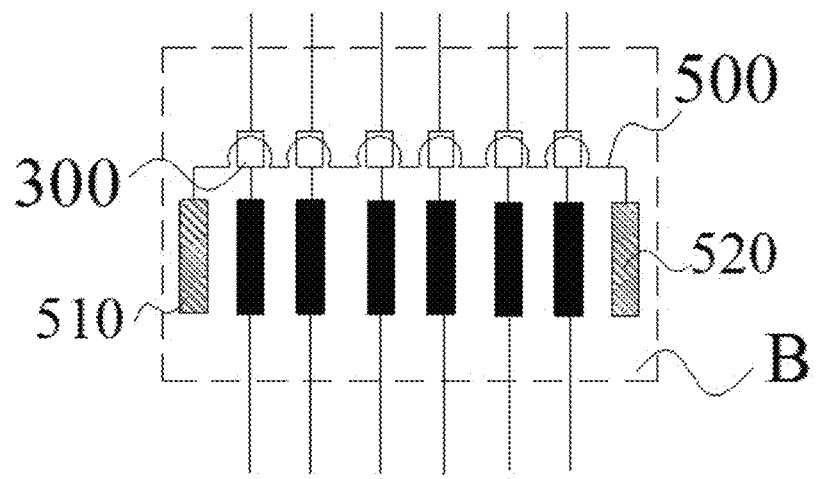
FIG. 6 is a schematic top view of a circuit region according to an embodiment of the present disclosure.

In some embodiments of the present disclosure, referring to FIG. 6, the switch line 500 may extend along the first direction and has a first connection terminal 510 and a second connection terminal 520 opposite to each other in the first direction. In this way, during a Module (MDL) lighting test, P-channel-oxide-semiconductor (PMOS) thin film transistors 300 are turned off by applying a forward direct current (DC) voltage to the two connection terminals 510 and 520, and thus, even if a conductive foreign matter X generated during the laser cutting process would cause the leads 400 to be coupled with each other, the defect of crosstalk can be prevented.

Figure 7:
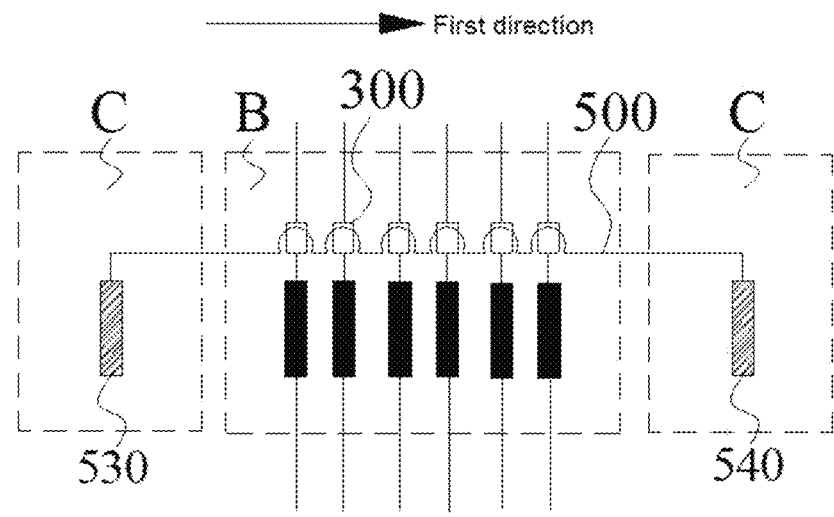
FIG. 7 is a schematic top view of a circuit region and test regions according to an embodiment of the present disclosure.
Figure 8:
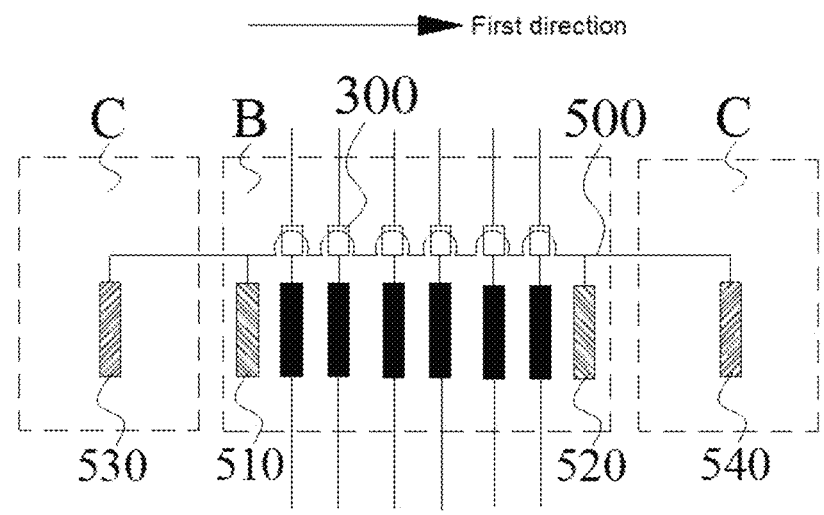
FIG. 8 is a schematic top view of a circuit region and test regions according to an embodiment of the present disclosure.

In other embodiments of the present disclosure, referring to FIG. 7 or FIG. 8, test regions C are further defined on the first surface of the substrate 100 (not shown), the test regions C and the circuit region B are located on a same side of the display region a (not shown), and the test regions C are located on both sides of the circuit region B in the first direction. Also, the switch line 500 further has a third connection terminal 530 and a fourth connection terminal 540 opposite to each other in the first direction, and the third connection terminal 530 and the fourth connection terminal 540 extend to the test regions C. In this way, during the exploratory (ET) lighting test, by applying a negative direct current (DC) voltage to the two connection terminals 530 and 540, the PMOS thin film transistors 300 are turned on simultaneously, and then by observing whether a dark line or a bright line appears in the display region A of the display panel, it can be determined whether there is a defect of the X-line caused by a conductive foreign matter generated during the cutting process.

According to the embodiments of the present disclosure, specific positions of the thin film transistors 300 are not particularly limited, as long as the thin film transistors 300 are disposed in the circuit region B, and those skilled in the art may design the positions of the thin film transistors 300 according to specific positions and directions of the leads 400, the signal line terminals 200, and the switch line 500. In some embodiments of the present disclosure, referring to FIG. 5, the plurality of leads 400 are disposed on a side of the plurality of signal line terminals 200 distal to the display region A, the switch line 500 is disposed between the plurality of leads 400 and the plurality of signal line terminals 200, and the thin film transistors 300 are respectively located at positions where the switch line 500 overlaps the leads 400 and the signal line terminals 200. Therefore, a region outside the display region A can be reduced, and a narrow bezel can be realized.

Figure 9:
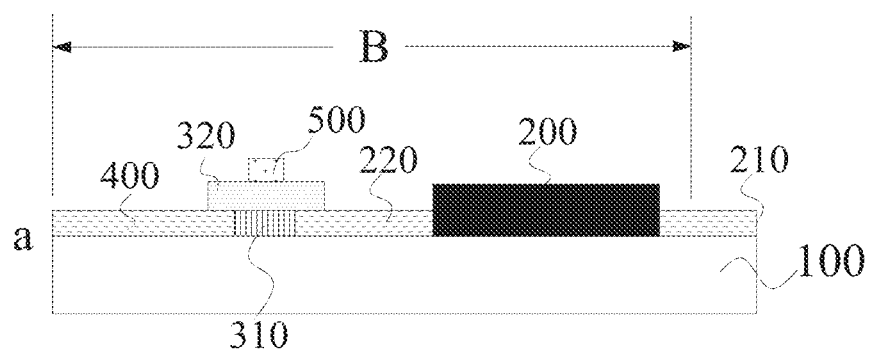
FIG. 9 is a schematic structural view of a longitudinal section of a switch element according to an embodiment of the present disclosure.

According to the embodiment of the present disclosure, the specific structure of each of the thin film transistors 300 is not particularly limited, as long as each of the thin film transistors 300 can achieve a control of connection and disconnection between the corresponding lead 400 and the corresponding signal line terminal 200, and those skilled in the art may change the structure of each of the thin film transistors 300 according to the specific position where it is disposed. In some embodiments of the present disclosure, referring to FIG. 9, the signal line terminal 200 is electrically connected with a first terminal of the TFT through a wire 220, at least a portion of the lead 400 may directly serve as a second terminal of the TFT, at least a portion of the switch line 500 may directly serve as a gate electrode of the TFT, and an active layer 310 is disposed between the lead 400 and the wire 220, an insulating layer 320 covers the active layer 310, a portion of the first terminal and a portion of the second terminal, and the switch line 500 is disposed on a surface of the insulating layer 320 distal to the active layer 310. Thus, the wire 220, the lead 400 and the switch line 500 are used as the first terminal, the second terminal and the gate electrode of the TFT respectively, so that steps and cost for separately manufacturing source and gate electrodes of the TFT can be saved. It should be noted that FIG. 9 is a schematic cross-sectional structure along the lead 400 between an edge of the substrate 100 to the display region A.

In summary, according to the embodiments of the present disclosure, in the circuit region of the display panel. TFTs are disposed between the signal line terminals connected with the signal lines and the leads in one-to-one correspondence, and by controlling the TFTs to be turned on or turned off, even if the conductive foreign matter generated during the laser cutting process would cause the leads to be coupled with each other, the defects of crosstalk and X-Line caused by the conductive foreign matter can be prevented, and the related problems can be completely eliminated, and therefore the quality of laser cutting and the manufacturing yield of the display panels are improved.

Figure 10:
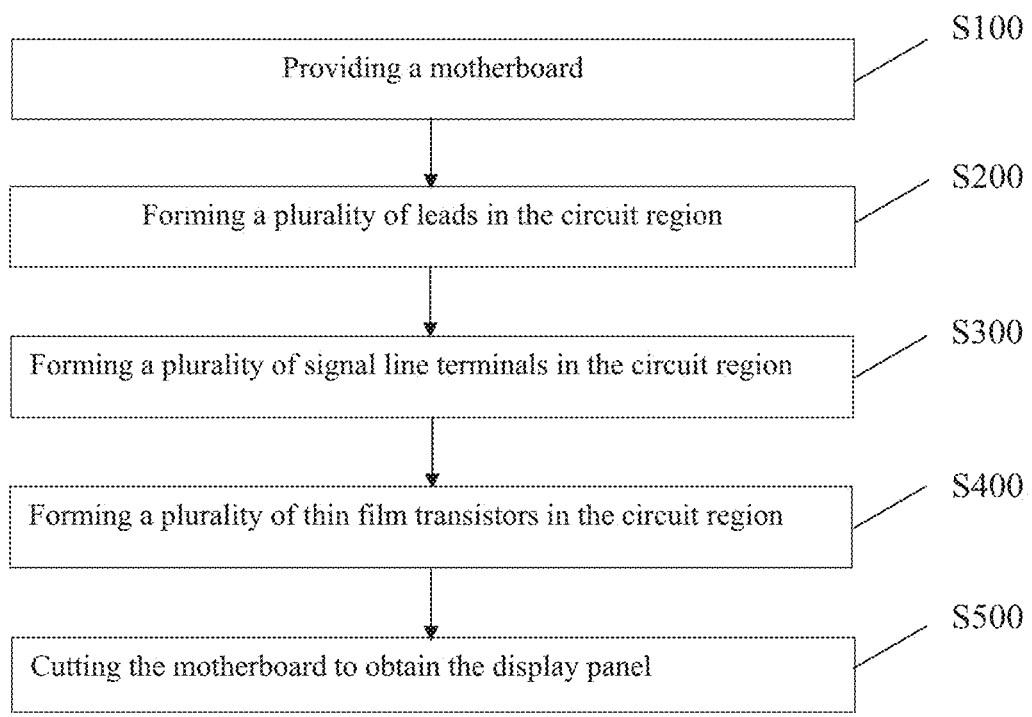
FIG. 10 is a schematic flow chart of a method for manufacturing a display panel according to an embodiment of the present disclosure.

In another aspect of the present disclosure, the present disclosure provides a method for manufacturing the display panel described above. Referring to FIG. 10, according to an embodiment of the present disclosure, the method includes the following steps S100 to S500.

In the step S100, a motherboard is provided.

In this step, the motherboard is provided, a plurality of effective regions are defined on a first surface "a" of the motherboard, and each effective region includes a display region A and a circuit region B, and the circuit region B is disposed on one side of the display region A. It should be noted that the "effective region" herein specifically refers to a region between cutting regions which is remained after cutting.

According to the embodiments of the present disclosure, a number of the effective regions and sizes of the display region A and the circuit region B in each effective region are not particularly limited, and may be designed and adjusted by those skilled in the art according to the actual requirement for size of the display panel to be manufactured, and details thereof are not repeated herein.

In the step S200, a plurality of leads are formed in the circuit region.

In this step, the plurality of leads 400 are formed in the circuit region B. According to the embodiment of the present disclosure, method for forming the plurality of leads 400 is not particularly limited, and those skilled in the art may change the method according to the specific material of the leads 400, and details thereof are not repeated herein In some embodiments of the present disclosure, the plurality of leads 400 may be spaced apart from each other along the first direction and extend along the second direction, and one end of each lead 400 in the second direction extends to an edge to be cut, so that the plurality of leads may be regularly disposed on one side of the circuit region B proximal to the edge to save space of the non-display region, thereby facilitating a designing for the narrow bezel.

In some embodiments, wires 220 may be formed simultaneously with the plurality of leads 400 through a single patterning process for connecting signal line terminals 200 formed subsequently with drain electrodes of thin film transistors 300 respectively. In this way, the thin film transistors 300 and the signal line terminals 200 may be electrically coupled together without an additional manufacturing process.

In the step S300, the plurality of signal line terminals are formed in the circuit region.

In this step, the plurality of signal line terminals 200 are formed in the circuit region B. According to the embodiments of the present disclosure, a method for forming the plurality of signal line terminals 200 is not particularly limited, and specifically, the method may be, for example, a plating or printing and the like, and may be selected by a person skilled in the art according to a material of the plurality of signal line terminals 200, and details thereof are not repeated herein.

In some embodiments of the present disclosure, the plurality of signal line terminals 200 may be formed on a side of the plurality of leads 400 proximal to the display region A, so that the plurality of signal line terminals 200 may be regularly disposed. Thus, an area of the non-display region may be further reduced to facilitate the designing for the narrow bezel. In some implementations, the plurality of signal line terminals 200 may be formed on a side of the wires 220 proximal to the display region A, and thus, the plurality of signal line terminals 200 may be directly electrically coupled with the thin film transistors 300 formed subsequently, respectively.

In the step S400, the plurality of thin film transistors are formed in the circuit region.

In this step, the plurality of thin film transistors 300 are formed in the circuit region B, and a first terminal of each thin film transistor 300 is electrically coupled with one signal line terminal 200, and a second terminal of the thin film transistor 300 is electrically coupled with one lead 400. According to the embodiments of the present disclosure, positions where the thin film transistors 300 are formed are not particularly limited, and those skilled in the art may change the positions according to positions and directions of the leads 400 and the signal line terminals 200, and details thereof are not repeated herein.

According to the embodiments of the present disclosure, a method for forming the thin film transistors 300 is not particularly limited, and those skilled in the art may change the method according to a specific structure of each of the thin film transistors 300. In some embodiments of the present disclosure, a first terminal of each of the thin film transistors 300 is formed by at least a portion of a corresponding wire 220 electrically coupled with a corresponding signal line terminal 200, and a second terminal of the thin film transistor 300 is formed by at least a portion of a corresponding lead 400. An active layer 310 may be formed between the lead 400 and the wire 220 first, then an insulating layer 320 may be formed on surfaces of the active layer 310, the wire 220 and the lead 400 distal to the motherboard, and a gate electrode of the thin film transistor 300 may be formed on a surface of the insulating layer 320 distal to the active layer 310, and the gate electrode may be formed by at least a portion of a switch line 500 to be formed. In this way, process steps and cost for manufacturing the thin film transistors may be saved.

In the step S500, the motherboard is cut to obtain display panels.

In this step, taking a manufacturing process of an OLED display panel as an example, the OLED display panel can be obtained by cutting the motherboard. Specifically, the cutting is performed along the cutting region between the effective regions, and the OLED display panel obtained by the cutting includes a display region A, a circuit region B, and test regions C.

Figure 12:
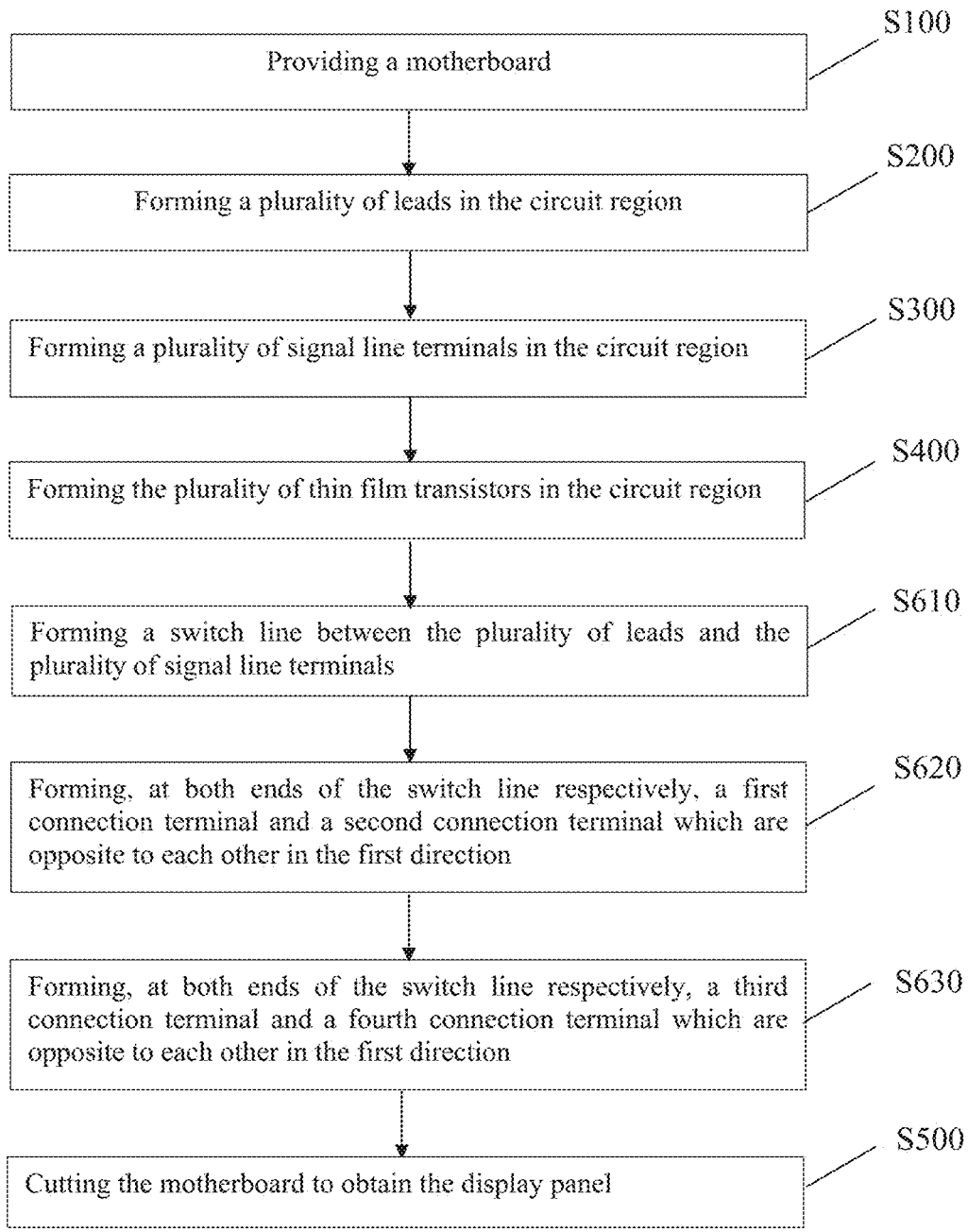
FIG. 12 is a schematic flow chart of a method for manufacturing a display panel according to an embodiment of the present disclosure.

In some embodiments of the present disclosure, referring to FIG. 12, between the step S400 and the step S500, the method may further include steps S610 to S630.

In the step S610, the switch line is formed between the plurality of leads and the plurality of signal line terminals.

In this step, the switch line 500 is formed between the leads and the signal line terminals, and the switch line 500 is electrically coupled with gate electrodes of the plurality of thin film transistors 300. According to the embodiments of the present disclosure, the method for forming the switch line 500 is not particularly limited, and those skilled in the art may change the method according to specific material of the switch line 500, and details thereof are not repeated herein.

In some embodiments of the present disclosure, segments of the switch line 500 may be formed at positions where the thin film transistors 300 overlap with the leads 400 and the signal line terminals 200 respectively, so that the switch line 500 may be directly used as the gate electrodes of the thin film transistors 300. In this way, process steps and cost for manufacturing the thin film transistors may be further saved.

In the step S620, a first connection terminal and a second connection terminal winch are opposite to each other in the first direction are respectively formed at both ends of the switch line, and the first connection terminal and the second connection terminal are both located in the circuit region.

In this step, the first connection terminal 510 and the second connection terminal 520 which are opposite to each other in the first direction may be formed on the switch line 500. Thus, during the module (MDL) lighting test, by applying a forward DC voltage to the first connection terminal 510 and the second connection terminal 520 in the circuit region B, the PMOS type thin film transistors 300 may be turned off, and even if a conductive foreign matter generated during the cutting process would cause the leads 400 to be coupled with each other, the defects of crosstalk can be prevented.

According to the embodiments of the present disclosure, a method for forming the first connection terminal 510 and the second connection terminal 520 is not particularly limited, and those skilled in the art may change the method according to a material of the two connection terminals, and details thereof are not repeated herein.

In the step S630, a third connection terminal and a fourth connection terminal which are opposite to each other in the first direction are respectively formed at both ends of the switch line, and the third connection terminal and the fourth connection terminal are located in the test regions.

In this step, the third connection terminal 530 and the fourth connection terminal 540 are formed in the test regions C of the motherboard, and the third connection terminal 530 and the fourth connection terminal 540 are oppositely disposed in the first direction of the switch line 500 and connected with the switch line 500. Thus, during the exploration (ET) lighting test, by applying a reverse DC voltage to the third connection terminal 530 and the fourth connection terminal 540, the plurality of PMOS type thin film transistors 300 are turned on simultaneously, and then by observing whether a dark line or a bright line appears in the display region A of the display panel, it can be determined that whether there is a defect of the X-line caused by a conductive foreign matter generated during the cutting process.

According to the embodiments of the present disclosure, a method for forming the third connection terminal 530 and the fourth connection terminal 540 is not particularly limited, and those skilled in the art may change the method according to a specific material of the two connection terminals, and details thereof are not repeated herein.

In summary, according to the embodiments of the present disclosure, a method for manufacturing a display panel is provided. The switch elements are disposed between signal line terminals and leads on the display panel manufactured by the method, and by controlling the plurality of switch elements, even if the conductive foreign matter generated during the cutting process would cause the leads to be coupled with each other, the defects of crosstalk and X-Line caused by the conductive foreign matter can be prevented, and therefore the quality of the cutting process and the yield of the display panels manufactured by the method are improved. It will be understood by those skilled in the art that the features and advantages described above for the display panel are still applicable to the method for manufacturing the display panel and will not be repeated herein.

In another aspect of the present disclosure, a method for detecting the display panel is provided.

Figure 11:
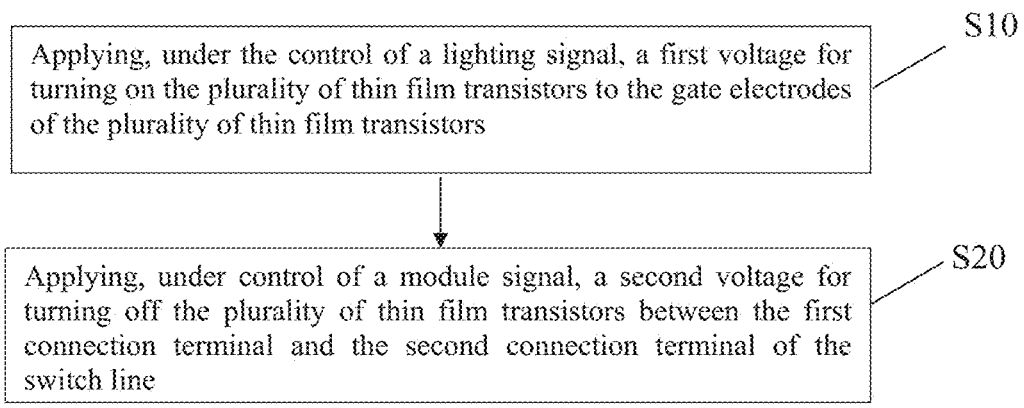
FIG. 11 is a schematic flow chart of a method for detecting a display panel according to an embodiment of the present disclosure.

According to an embodiment of the present disclosure, referring to FIG. 11, the method for detecting the display panel includes step S10.

In the step S10, under the control of a lighting signal, a first voltage for turning on the plurality of thin film transistors is applied to gate electrodes of the plurality of thin film transistors.

In this step, under the control of the lighting signal, the first voltage is applied to the gate electrodes of the plurality of thin film transistors 300 to turn on the plurality of thin film transistors 300, so that it is possible to detect whether or not the conductive foreign matter X is generated by the cutting process. It should be noted that the "lighting signal" specifically means that a data voltage for displaying a white screen provided to the data line of each of R, G and B sub-pixels, for example.

According to the embodiments of the present disclosure, the first voltage is applied to the gate electrodes of the plurality of thin film transistors 300, so that all of the plurality of thin film transistors 300 are turned on, while under the control of the lighting signal, specifically, data signals are applied to the plurality of signal line terminals 200 respectively.

Taking the red (R), green (G) and blue (B) sub-pixels as an example, an Rdata voltage is applied to the signal line terminal 200 coupled with the red sub-pixel, a Gdata voltage is applied to the signal line terminal 200 coupled with the green sub-pixel, and a Bdata voltage is applied to the signal line terminal 200 coupled with the blue sub-pixel, and in general, the Rdata voltage, the Gdata voltage, and the Bdata voltage are different depending on different materials for the red sub-pixel unit, the green sub-pixel unit and the blue sub-pixel unit.

In some implementations of the present disclosure, a circuit in a case where there is no short circuit caused by the conductive foreign matter X after the cutting process may be referred to FIG. 3. Under the control of the lighting signal, the data signals are respectively applied to the plurality of signal line terminals 200, and the first voltage is applied to the gate electrodes SW of the plurality of thin film transistors 300, so that all of the plurality of thin film transistors 300 are turned on, and thus, sub-pixel units electrically coupled with the signal line terminals 200 through the signal lines 210 respectively can display normally. That is, it can be observed that the display area A of the display panel can display normally (i.e., brightness of the entire screen is uniform), and thus it can be determined that the cutting process has a good quality, and no conductive foreign matter exists.

Figure 4:
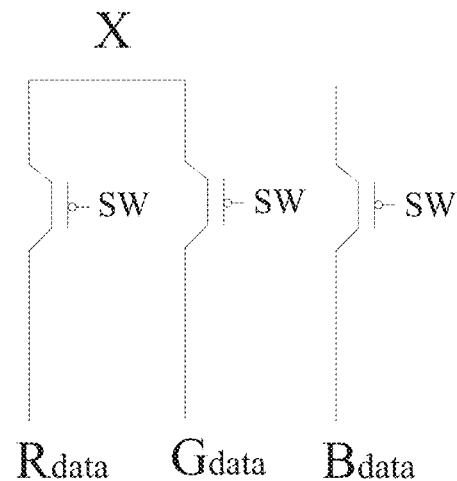
FIG. 4 is an equivalent circuit schematic diagram of switch elements with conductive foreign matter according to an embodiment of the present disclosure.

In other implementations of the present disclosure, a circuit in a case where there is a short circuit caused by the conductive foreign matter X after the cutting process may be referred to FIG. 4. Under the control of the lighting signal, the data signals are respectively applied to the plurality of signal line terminals 200, and the first voltage is applied to the gate electrodes SW of the plurality of thin film transistors 300, so that all of the plurality of thin film transistors 300 are turned on, and thus, for example, since the data voltages of the red sub-pixel and the green sub-pixel, which are short-circuited by the conductive foreign matter X generated during the cutting process, are different, i.e., Rdata voltage≠ Gdata voltage, thereby causing a cross-talk problem between the data voltages of the two sub-pixels and a display voltage abnormality of two columns of sub-pixels coupled with the two signal line terminals 200, thus at least one longitudinal bright line or dark line may be observed in the display region A of the display panel, and it can be determined that a short circuit problem caused by the conductive foreign matter exists after the cutting process.

In some embodiments of the present disclosure, the gate electrode of each of the plurality of thin film transistors 300 is electrically coupled with the switch line 500, and the first voltage is applied to the third connection terminal 530 and the fourth connection terminal 540 of the switch line 500, and the third connection terminal 530 and the fourth connection terminal 540 are oppositely disposed in the first direction of the switch line 500 and extend to the test regions C of the motherboard, so that under the control of the switch line 500, the plurality of TFTs 300 can be turned on simultaneously.

In some embodiments of the present disclosure, as for the PMOS type thin film transistors 300 of which the active layer 310 is made of the oxide material, the first voltage may be a reverse DC voltage, and thus, by applying the reverse DC voltage to the gate electrode, the thin film transistor may be turned on. According to the embodiments of the disclosure, a value of the first voltage is not particularly limited, as long as the value of the first voltage can cause the thin film transistor 300 to be turned on, specifically, for example, the value of the first voltage may range from −5V to −7V, and the like, and those skilled in the art may select the value of the first voltage according to the specific electrical property of the thin film transistor 300, and details thereof are not repeated herein.

In some embodiments of the present disclosure, referring to FIG. 11, the method for detecting the display panel further includes a step S20.

In the step S20, under the control of a module signal, a second voltage for turning off the plurality of thin film transistors is applied between the first connection terminal and the second connection terminal of the switch line.

In this step, under the control of the module signal, the second voltage is applied between the first connection terminal 510 and the second connection terminal 520 of the switch line 500 to turn off the plurality of thin film transistors 300. The first connection terminal 510 and the second connection terminal 520 are oppositely disposed in the first direction of the switch line 500, so that, by turning off the plurality of the thin film transistors 300, the defects of the X-Line and crosstalk may be prevented even if a short circuit problem caused by the conductive foreign matter X after the cutting process is detected in the step S10, thereby improving the quality of the cutting process and the manufacturing yield of the display panel. It should be noted that, specifically, the "module signal" refers to, for example, a data voltage, corresponding to a picture to be displayed, provided to the data line of each of the R, G and B sub-pixels.

In some embodiments of the present disclosure, the gate electrode of each of the plurality of thin film transistors 300 is electrically coupled with the switch line 500, and the second voltage is applied between the first connection terminal 510 and the second connection terminal 520 of the switch line 500, where the first connection terminal 510 and the second connection terminal 520 are oppositely disposed in the first direction of the switch line 500, so that under the control of the switch line 500, the plurality of TFTs 300 can be turned off simultaneously.

In some embodiments of the present disclosure, as for the PMOS type thin film transistor 300 of which the active layer 310 is made of the oxide material, the second voltage may be a forward DC voltage, and thus, by applying the forward DC voltage to the gate electrode, the thin film transistor may be turned off. According to the embodiment of the disclosure, a value of the second voltage is not particularly limited, as long as the value of the second voltage can cause the thin film transistor 300 to be turned off, specifically, for example, the value of the second voltage may be 7V and the like, and those skilled in the art may change the value of the second voltage according to a specific electrical property of the thin film transistor 300, and details thereof are not repeated herein.

In summary, according to the embodiments of the present disclosure, a method for detecting the display panel is provided. The thin film transistors may be turned on by applying the first voltage to the gate electrode of each of the thin film transistors disposed between the signal line terminals and the leads, thus during the ET lighting test, it can be determined whether the conductive foreign matter is generated by the cutting process, by observing whether a dark line or a bright line appears on the display panel. It will be understood by those skilled in the art that the features and advantages described above for the display panel are still applicable to the method for detecting the display panel, and details thereof are not repeated herein.

In another aspect of the present disclosure, a display device is provided. According to an embodiment of the present disclosure, the display device includes the display panel described above.

According to the embodiments of the present disclosure, the type of the display device is not particularly limited, and the display panel may be, for example, an organic light emitting diode (OLED) display, a quantum dot light emitting (QLED) display, and the like, and those skilled in the art may choose the type of the display device according to the specific usage requirement for the display device, and details thereof are not repeated herein. According to the embodiments of the present disclosure, the kind of the display device is not particularly limited, and it can be any display device commonly used in the art, specifically, for example, a display, a mobile device, a wearable device, and the like, and those skilled in the art may choose the display device according to the specific usage of the display device, and details thereof are not repeated herein.

It should be noted that, the display device further includes other necessary components and structures besides the display panel. Taking the OLED display as an example, specifically, for example, a housing, a circuit board, a power line and the like, are further included therein, and other components or structures may be added into the OLED display by those skilled in the art according to the specific usage requirements for the display device, and details thereof are not repeated herein.

In summary, according to the embodiments of the present disclosure, the present disclosure provides a display device, in which the cutting quality of the display panel is improved and the manufacturing yield is better, so that the display quality of the display device is better and the long-term service life of the display device is longer. It will be appreciated by those skilled in the art that the features and advantages described above for the display panel are still applicable to the display device and details thereof are not repeated herein.

According to the present disclosure, it should be understood that the orientations and positional relationships indicated by the terms "center", "longitudinal", "lateral", "length", "width", "thickness", "upper", "lower", "front", "behind", "left", "right", "vertical", "horizontal", "top", "bottom", "inner". "outer", "clockwise", "counterclockwise", "axial", "radial", "circumferential", and the like are indicated as the orientations and positional relationships shown in the drawings, and the terms are used for facilitating to describe the present disclosure and to simplify the description, but are not intended to indicate or imply that the device or element must has a particular orientation, be constructed and operated in the particular orientation, and cannot be understood as a limitation on the present disclosure.

Furthermore, the terms "first" and "second" are used for descriptive purposes only and are not to be construed as indicating or implying relative importance or implicitly indicating the number of technical features indicated. Thus, a feature defined as "first" or "second" may explicitly or implicitly include at least one such feature. In the description of the present disclosure, "a plurality" means at least two, e.g., two, three, etc., unless explicitly specifically defined otherwise.

In the description herein, the term such as "an embodiment", "some embodiments", "an example". "a specific example", or "some examples", etc., means that the features, structures, materials, or characteristics described in connection with the embodiment or the example are included in at least one embodiment or example of the present disclosure. In this specification, the schematic descriptions of the terms used above are not necessarily referred to a same embodiment or example. Also, the particular features, structures, materials, or characteristics described may be combined in any suitable manner in any one or more embodiments or examples. Furthermore, various embodiments or examples and features of different embodiments or examples described herein can be combined by those skilled in the art without contradiction.

Although embodiments of the present disclosure have been shown and described above, it should be understood that the above embodiments are exemplary and should not be construed as a limitation on the present disclosure, and that changes, modifications, substitutions and alterations may be made to the above embodiments by those skilled in the art within the scope of the present disclosure.

What is claimed is:

1. A display panel, comprising:
a substrate, wherein a surface of the substrate comprises a display region, a circuit region and two test regions thereon, the two test regions and the circuit region are located at a same side of the display region, and the two test regions are located at both sides of the circuit region in a first direction, respectively;
a plurality of signal line terminals located in the circuit region, the plurality of signal line terminals are electrically coupled with signal lines for the display region in one-to-one correspondence;
a plurality of switch elements located in the circuit region, each of the plurality of switch elements has a first terminal and a second terminal, first terminals of the plurality of switch elements are electrically coupled with the plurality of signal line terminals in one-to-one correspondence;
a plurality of leads located in the circuit region and on a side of the plurality of switch elements distal to the display region, spaced apart from each other along a first direction and extending along a second direction, first ends of the plurality of leads in the second direction are electrically coupled with the second terminals of the plurality of switch elements in one-to-one correspondence, and second ends of the plurality of leads in the second direction extend to an edge of the substrate,
a switch line located between the plurality of leads and the plurality of signal line terminals and extending along the first direction, wherein each of the plurality of switch elements further has a third terminal, the switch line is electrically coupled with the third terminal of each of the plurality of switch elements, and the third terminal of each of the plurality of switch elements is configured to control the first terminal and the second terminal thereof to be connected or disconnected,
the switch line has a first connection terminal and a second connection terminal opposite to each other in the first direction, and the first connection terminal and the second connection terminal both are located in the circuit region,
the switch line extends into the two test regions and has a third connection terminal and a fourth connection terminal opposite to each other in the first direction, and the third connection terminal and the fourth connection terminal are located in the two test regions, respectively, and wherein
the first terminal and the second terminal are configured to enable the plurality of the switching elements to be turned off during a module lighting test, and the third terminal and the fourth terminal are configured to enable the plurality of the switching elements to be turned on during an exploratory lighting test, and
the first connection terminal and the second connection terminal are between the third connection terminal and the fourth connection terminal in the first direction.

2. The display panel of claim 1, wherein the plurality of switch elements are located at positions where the switch lines overlap the plurality of leads and the plurality of signal line terminals, respectively.

3. The display panel of claim 1, wherein each of the plurality of switch elements is a thin film transistor.

4. A display device, comprising the display panel of claim 1.

5. A method for detecting a display panel, wherein the display panel comprises:
a substrate, wherein a surface of the substrate comprises a display region, a circuit region and two test regions thereon, the two test regions and the circuit region are located at a same side of the display region, and the two test regions are located at both sides of the circuit region in a first direction, respectively;
a plurality of signal line terminals located in the circuit region, the plurality of signal line terminals are electrically coupled with signal lines for the display region in one-to-one correspondence;
a plurality of switch elements located in the circuit region, each of the plurality of switch elements has a first terminal and a second terminal, first terminals of the plurality of switch elements are electrically coupled with the plurality of signal line terminals in one-to-one correspondence;
a plurality of leads located in the circuit region and on a side of the plurality of switch elements distal to the display region, spaced apart from each other along a first direction and extending along a second direction, first ends of the plurality of leads in the second direction are electrically coupled with the second terminals of the plurality of switch elements in one-to-one correspondence, and second ends of the plurality of leads in the second direction extend to an edge of the substrate,
a switch line located between the plurality of leads and the plurality of signal line terminals and extending along the first direction, wherein each of the plurality of switch elements further has a third terminal, the switch line is electrically coupled with the third terminal of each of the plurality of switch elements, and the third terminal of each of the plurality of switch elements is configured to control the first terminal and the second terminal thereof to be connected or disconnected,
the switch line has a first connection terminal and a second connection terminal opposite to each other in the first direction, and the first connection terminal and the second connection terminal both are located in the circuit region,
the switch line extends into the two test regions and has a third connection terminal and a fourth connection terminal opposite to each other in the first direction, and the third connection terminal and the fourth connection terminal are located in the two test regions, respectively, and wherein
the first connection terminal and the second connection terminal are between the third connection terminal and the fourth connection terminal in the first direction, and
the first terminal and the second terminal are configured to enable the plurality of the switching elements to be turned off during a module lighting test, and the third terminal and the fourth terminal are configured to enable the plurality of the switching elements to be turned on during an exploratory lighting test, and
the method comprises:
applying, under the control of a lighting signal, a first voltage to each of the plurality of switch elements such that the plurality of switch elements are turned on.

6. The method of claim 5
wherein each of the plurality of switch elements is a thin film transistor, and the applying, under the control of the lighting signal, the first voltage to each of the plurality of switch elements such that the plurality of switch elements are turned on further comprises:

applying the first voltage between the third connection terminal and the fourth connection terminal of the switch line to turn on each of the thin film transistors.

7. The method of claim 6, further comprising:

applying, under the control of a module signal, a second voltage between the first connection terminal and the second connection terminal of the switch line to turn off each of the thin film transistors.

\* \* \* \* \*